United States Patent
Seki

(10) Patent No.: US 7,126,508 B2
(45) Date of Patent: Oct. 24, 2006

(54) ANALOG-TO-DIGITAL CONVERSION SYSTEM, CORRECTION CIRCUIT, AND CORRECTION METHOD

(75) Inventor: Katsutoshi Seki, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/152,392

(22) Filed: Jun. 15, 2005

(65) Prior Publication Data

US 2005/0280566 A1    Dec. 22, 2005

(30) Foreign Application Priority Data

Jun. 16, 2004 (JP) ............................. 2004-178775

(51) Int. Cl.
*H03M 1/06* (2006.01)
(52) U.S. Cl. ...................................... 341/118; 341/161
(58) Field of Classification Search ................ 341/118, 341/155, 161, 120, 143
See application file for complete search history.

(56) References Cited

U.S. PATENT DOCUMENTS

| | | | | |
|---|---|---|---|---|
| 5,255,202 A | * | 10/1993 | Kido et al. | ................. 702/190 |
| 6,587,528 B1 | * | 7/2003 | Wynn | .......................... 375/362 |
| 6,606,042 B1 | | 8/2003 | Sonkusale et al. | |
| 6,970,120 B1 | * | 11/2005 | Bjornsen | .................... 341/120 |

OTHER PUBLICATIONS

Masanori Furuta, et al., "A Digital Calibration Technique for Pipelined Analog-to-Digital Converters", IEEE Instrumentation and Measurement Technology Conference May 21-23, 2002, pp. 713-717.

X. Wang, et al., "A 12-bit 20-MS/s Pipelined ADC, with Nested Digital Background Calibration", IEEE Custom Integrated Circuits Conference, 2003, pp. 409-412, no month.

* cited by examiner

*Primary Examiner*—Peguy JeanPierre
(74) *Attorney, Agent, or Firm*—McGinn IP Law Group, PLLC

(57) ABSTRACT

Disclosed is an interleaved ADC comprising first and second component ADCs that use pipelined ADCs extracts an image component, which is generated by a gain error, with the use of a band pass filter for correcting the gain error so that the power of the image component is minimized.

20 Claims, 6 Drawing Sheets

ANALOG-TO-DIGITAL CONVERSION SYSTEM, CORRECTION CIRCUIT, AND CORRECTION METHOD

FIELD OF THE INVENTION

The present invention relates to an analog-to-digital conversion circuit, and more particularly to a correction circuit, a correction method, and a correction system advantageously applicable to a pipelined analog-to-digital conversion circuit.

BACKGROUND OF THE INVENTION

Recently, there is an increasing need for a high speed, high precision, and low consumption analog-to-digital conversion circuit (hereinafter called an ADC). One of proposed means for implementing a high speed and high precision ADC is an interleaved ADC in which a plurality of high precision ADCs are provided in parallel for time-dividing operation among them. Each of parallel, high precision ADCs is called a "component ADC". As a component ADC, a pipelined ADC is usually used because it has a relatively simple configuration but provides high precision.

When a capacitor of low capacitance value is used in a pipelined ADC to meet the low power dissipation requirement, a non-linear error (INL: integral non-linearity) is caused primarily by a gain error in each pipeline stage. Therefore, to improve the INL, the gain error in each pipeline stage must be corrected. For the correction of pipelined ADC errors, refer to Non-Patent Documents 1 and 2 and Patent Document 1. Non-Patent Document 1 describes the configuration of a pipelined ADC that employs the 1.5-bit/stage algorithm. This document also describes a calibration method for a pipelined ADC offset and a gain error.

FIG. 5 is a diagram showing an example of the configuration of a correction circuit which uses a known calibration signal in order to correct a gain error. FIG. 5 shows a two-phase interleaved ADC where two component ADCs are provided in parallel. Referring to FIG. 5, in this AD conversion system includes a first AD converter 10 (also called a first component ADC) which comprises a first pipelined AD converter 11 (also called a first pipelined ADC) and a first gain error correction circuit 12; a second AD converter 20 (also called a second component ADC) which comprises a second pipelined AD converter 21 (also called a second pipelined ADC) and a second gain error correction circuit 22; a correction circuit 30A which comprises a parallel-to-serial (PS) conversion circuit (2:1 multiplexer) 31, a calibration signal replica generation unit 35, a subtracter 36, and a correction circuit control unit 34A; a calibration signal generation unit 40A; and a divide-by-2 multi-phase circuit 50.

A known calibration signal (for example, known linear ramp waveform) generated by the calibration signal generation unit 40A is sampled by the two component ADCs 10 and 20 with respective phases spaced one half period each other.

The divide-by-2 multi-phase circuit 50 divides the reference clock signal by two and generates two divided clock signals that are spaced by one half clock period each other.

The first and second pipelined ADCs 11 and 21 sample received signals with respective phases, based on the divided clock signals which are supplied from the divide-by-2 multi-phase circuit 50 and which are spaced by one half clock period each other.

In response to the output from the first and second pipelined AD converters 11 and 21, the first and second gain error correction circuits 12 and 22 correct a gain error and output the correction result (digital signal).

The parallel-to-serial conversion circuit (multiplexer) 31 receives the digital signals which are output respectively from the two component ADCs 10 and 20 that sample the calibration signal using the divided clock signals spaced by one half clock period each other, multiplexes the digital signals at the ratio of 2:1, and outputs the multiplexed signal.

The subtracter 36 outputs the difference (result of subtraction) between the digital output signal from the parallel-to-serial conversion circuit (multiplexer) 31 and the calibration signal replica (digital signal with the known linear ramp waveform) from the calibration signal replica generation unit 35.

The correction circuit control unit 34A receives the difference output from the subtracter 36, generates correction amount control signals #1 and #2 used to control the gain error correction used in the first and second gain error correction circuits 12 and 22 so that the absolute value of the difference is reduced (minimized), and supplies the generated correction amount control signals #1 and #2 to the first and second gain error correction circuits 12 and 22.

The correction circuit with the configuration described above corrects the gain error in the first and second pipelined ADCs 11 and 21 to improve the characteristics of non-linear errors caused by gain errors.

FIG. 6 is a diagram showing an example of a correction circuit with the configuration in which a low-speed and high-precision reference ADC is used for a correction method that is different from that shown in FIG. 5. Referring to FIG. 6, this conventional AD conversion system comprises a reference ADC 60, which comprises a low-speed/high-precision AD converter 61 (reference ADC), instead of the calibration signal replica generation unit 35 in FIG. 5; and a calibration signal generation unit 40B (which generates any calibration signal) instead of the calibration signal generation unit 40A (which generates a known calibration signal) in FIG. 5. The calibration signal from the calibration signal generation unit 40B is supplied to the first and second pipelined AD converters 11 and 21 and to the low-speed/high-precision reference ADC 61. Divide-by-2 multi-phase clock signals, which are output from a frequency-division multi-phase circuit 50B and are spaced each other, are supplied to the ADCs 10 and 20 respectively, and a low-speed clock signal with a divider ratio higher than that for the ADCs 10 and 20 is supplied from the frequency-division multi-phase circuit 50B to the low-speed/high-precision reference ADC 61.

That is, in the configuration shown in FIG. 6, the subtracter 36 calculates the difference between the received signal (digital signal) sampled by the ADCs 10 and 20 instead of the calibration signal replica signal in FIG. 5 and the received signal (digital signal) sampled by the low-speed/high-precision reference ADC 61. A correction circuit control unit 34B controls the correction of a gain error so that the absolute value of this difference is reduced (minimized).

While a known calibration signal is used in the configuration shown in FIG. 5, any calibration signal from the calibration signal generation unit 40B can be used in the configuration shown in FIG. 6. The calibration signal doesn't have to be a known signal as in FIG. 5. Nor is it required for the subtracter 36 to calculate the difference on every sample. Therefore, the low-speed clock signal, whose frequency is divided by the frequency-division multi-phase circuit 50B, is used for the low-speed/high-precision reference ADC 61. For an example of the configuration shown in FIG. 6, see Patent Publication 1.

[Non-Patent Document 1]
Masanori Furuta, Shoji Kawahito, and Daisuke Miyazaki, "A Digital Calibration Technique for Pipelined Analog-to-Digital Converters," IEEE Instrumentation and Measurement Technology Conference 21–23 May 2002, pp. 713–717

[Non-Patent Document 2]
X. Wang, P. J. Hurst, and S. H. Lewis, "A 12-bit 20-MS/s Pipelined ADC with Nested Digital Background Calibration," IEEE CUSTOM INTEGRATED CIRCUITS CONFERENCE, 2003, pp. 409–412

[Patent Document 1]
U.S. Pat. No. 6,606,042 Specification

SUMMARY OF THE DISCLOSURE

One of the problems with the configuration shown in FIG. 5 is that the gain error correction capability depends on the precision of the known calibration signal because the gain error is controlled based on the difference between the known calibration signal replica and the received sampling signal.

In addition, a high-precision known calibration signal, if used, would result in an increase in the circuit size. An attempt to make the calibration signal generation unit 40A, which generates known signals, highly precise and accurate would increase the cost.

In the configuration shown in FIG. 6, the gain error is controlled by the difference between the signal sampled by the low-speed/high-precision reference ADC 61 and the signal received and sampled by the ADCs 10 and 20. This means that the gain error correction capability depends on the precision of the reference ADC 61. An attempt to use a high-precision reference ADC for higher precision would result in an increase in the circuit size.

The following present on overview of the invention disclosed by this application.

A system in accordance with one aspect of the present invention comprises: a pipelined analog-to-digital conversion circuit that receives an analog signal and converts the analog signal to a digital signal for output; and a correction circuit that controls a correction of a gain error of the analog-to-digital conversion circuit, wherein the correction circuit comprises: a filter that receives the output signal of the analog-to-digital conversion circuit and extracts a predetermined frequency component generated by a gain error of the analog-to-digital conversion circuit; and a control circuit that supplies a control signal, which corrects the gain error of the analog-to-digital conversion circuit, to the analog-to-digital conversion circuit based on the frequency component extracted by the filter.

A method according to another aspect of the present invention is a correction method for a pipelined analog-to-digital conversion circuit that receives an analog signal, converts the analog signal to a digital signal, and outputs the converted signal. The correction method comprises the steps of:

(A1) receiving the output signal of the analog-to-digital conversion circuit and extracting a frequency component, generated by a gain error of the analog-to-digital conversion circuit, with a filter; and (A2) correcting the gain error of the analog-to-digital conversion circuit based on the frequency component extracted by the filter.

A still another aspect of the present invention is a correction circuit for correcting a gain error of a pipelined analog-to-digital conversion circuit that receives an analog signal, converts the analog signal to a digital signal, and outputs the converted signal. The correction circuit comprises a filter that receives the output signal of the analog-to-digital conversion circuit and extracts a frequency component generated by a gain error of the analog-to-digital conversion circuit; and a control circuit that calculates a power of the frequency component extracted by the filter and outputs a control signal for correcting the gain error of the analog-to-digital conversion circuit to reduce a value of the power.

The meritorious effects of the present invention are summarized as follows.

The system according to the present invention improves the gain error correction capability and, even if a gain error occurs in a pipelined ADC, prevents the non-linear error (INL) characteristics from deteriorating.

In addition, unlike the conventional correction method, the correction method according to the present invention requires neither an accurate known calibration signal generation circuit nor a high-precision reference ADC. Thus, the method reduces the circuit size and the cost while improving the characteristics.

Still other effects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED DESCRIPTION OF THE INVENTION

Embodiments of the present invention will be described. An AD conversion system, according to an embodiment of the present invention, comprises an interleaved ADC, where a pipelined ADC is used in a component ADC. The system extracts an image component, generated by a gain error of the pipelined ADC, with the use of a band pass filter (32 in FIG. 1) and corrects the gain error so that the power of the image component is reduced or minimized.

A calibration signal received by the analog input terminal of the pipelined ADC is preferably a band-limited training signal. A band pass filter (32) is adapted to let a signal of a predetermined range of frequency band selectively pass through. The predetermined range of frequency band includes a frequency obtained by subtracting a center frequency (fi) of the band-limited training signal from the Nyquist frequency (fs/2). A power calculation unit (33) calculates the power of the signal output from the band pass filter (32). A correction control unit (34) receives the power calculation result and generates a control signal for correcting the gain error of the ADC. The control signal is supplied to the gain error correction circuit of the ADC to reduce the gain error of the ADC. The embodiment will be described more in detail with reference to the drawings.

Figure 1:
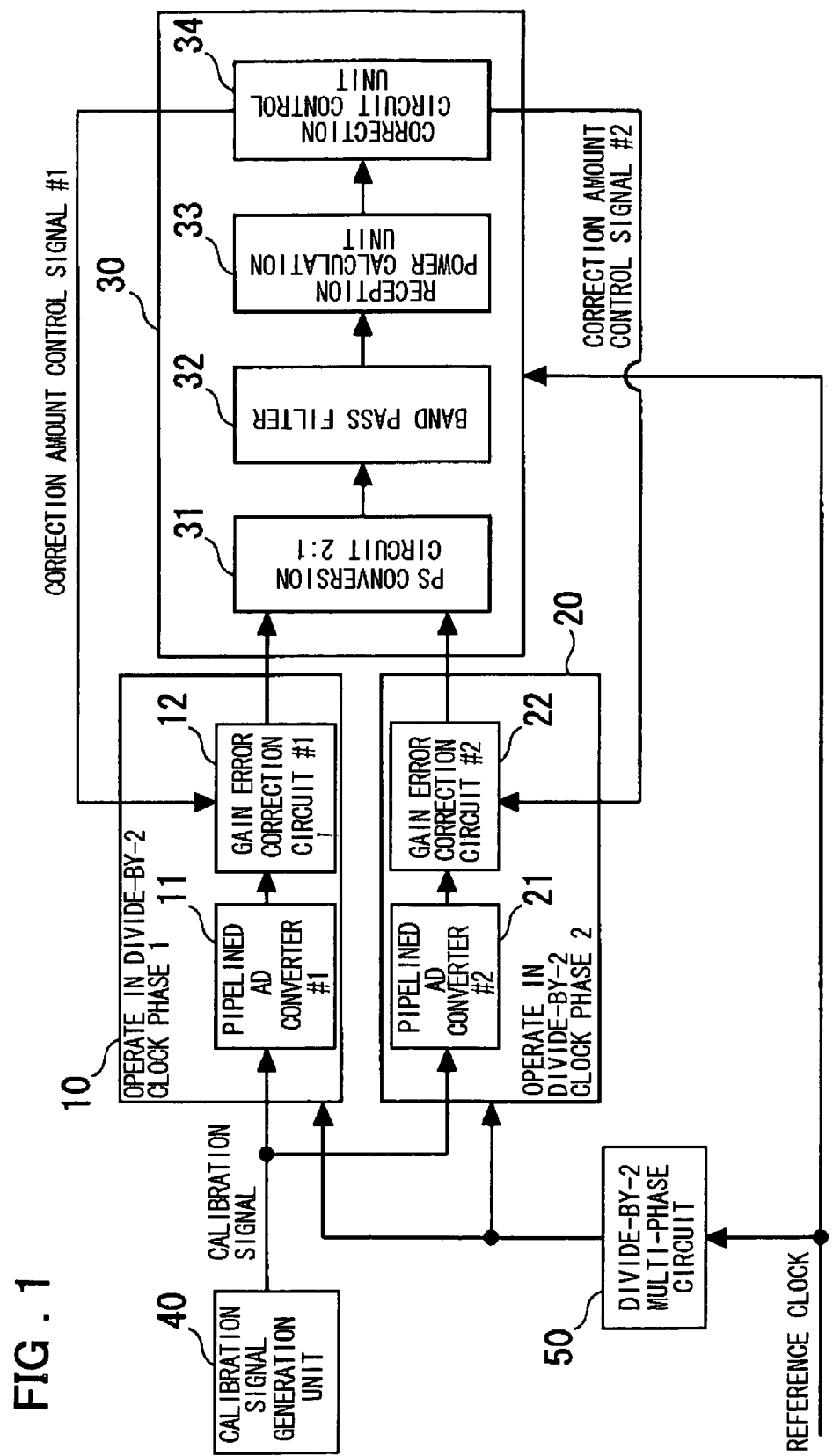
FIG. 1 is a diagram showing the configuration of one embodiment of the present invention.

FIG. 1 is a diagram showing the configuration of one embodiment of the present invention. FIG. 1 shows a two-phase interleaved ADC where two component ADCs are provided in parallel. That is, the AD conversion system in one embodiment of the present invention comprises a first ADC 10 (a first component ADC) which includes a first pipelined AD converter 11 (a first pipelined ADC) and a first gain error correction circuit 12; a second ADC 20 (a second component ADC) which includes a second pipelined AD converter 21 (a second pipelined ADC) and a second gain error correction circuit 22; and a correction circuit 30 which includes a parallel-to-serial (PS) conversion circuit (2:1 multiplexer) 31 that receives serial digital signals output from the ADCs 10 and 20, and multiplexes them, a band pass filter 32 that receives the output of the parallel-to-serial conversion circuit 31, a reception power calculation unit 33 that calculates the power of the output signal of the band pass filter 32, and a correction circuit control unit 34. The AD conversion system further comprises a calibration signal generation unit 40 and a divide-by-2 multi-phase circuit 50.

A calibration signal generated by the calibration signal generation unit 40 is sampled by the two component ADCs 10 and 20 with respective phases that are spaced by one half a period each other.

The divide-by-2 multi-phase circuit 50 divides the reference clock signal by two and generates two divided clock signals spaced by one half a period each other.

The first and second pipelined ADCs 11 and 21 receive an input analog signal at respective analog input terminals thereof and sample the input analog signal with phases spaced each other, based on the divided clocks that are supplied from the divide-by-2 multi-phase circuit 50 and are spaced by one half a period each other.

In response to the output signal from the first and second pipelined AD converters 11 and 21, the first and second gain error correction circuits 12 and 22 correct a gain error and output the correction result (digital signal).

The parallel-to-serial conversion circuit (multiplexer) 31 receives the digital signals, which are output respectively from the two component ADCs 10 and 20 that sample the input analog signal using the divided clock signals spaced by one half a period each other, multiplexes the digital signals at the ratio of 2:1, and outputs the multiplexed signal.

The band pass filter 32 receives the output from the parallel-to-serial conversion circuit (multiplexer) 31 and selectively lets the signal in a predetermined frequency band pass through the filter (that is, an image component generated by a gain error).

The reception power calculation unit 33 calculates the power of the frequency components output by the band pass filter 32. The correction circuit control unit 34 receives the power calculation result from the reception power calculation unit 33, generates the correction amount control signal for correcting the gain error of the ADCs 10 and 20 so that the gain error is reduced, and outputs the generated correction amount control signal to the gain error correction circuits 12 and 22.

Figure 2:
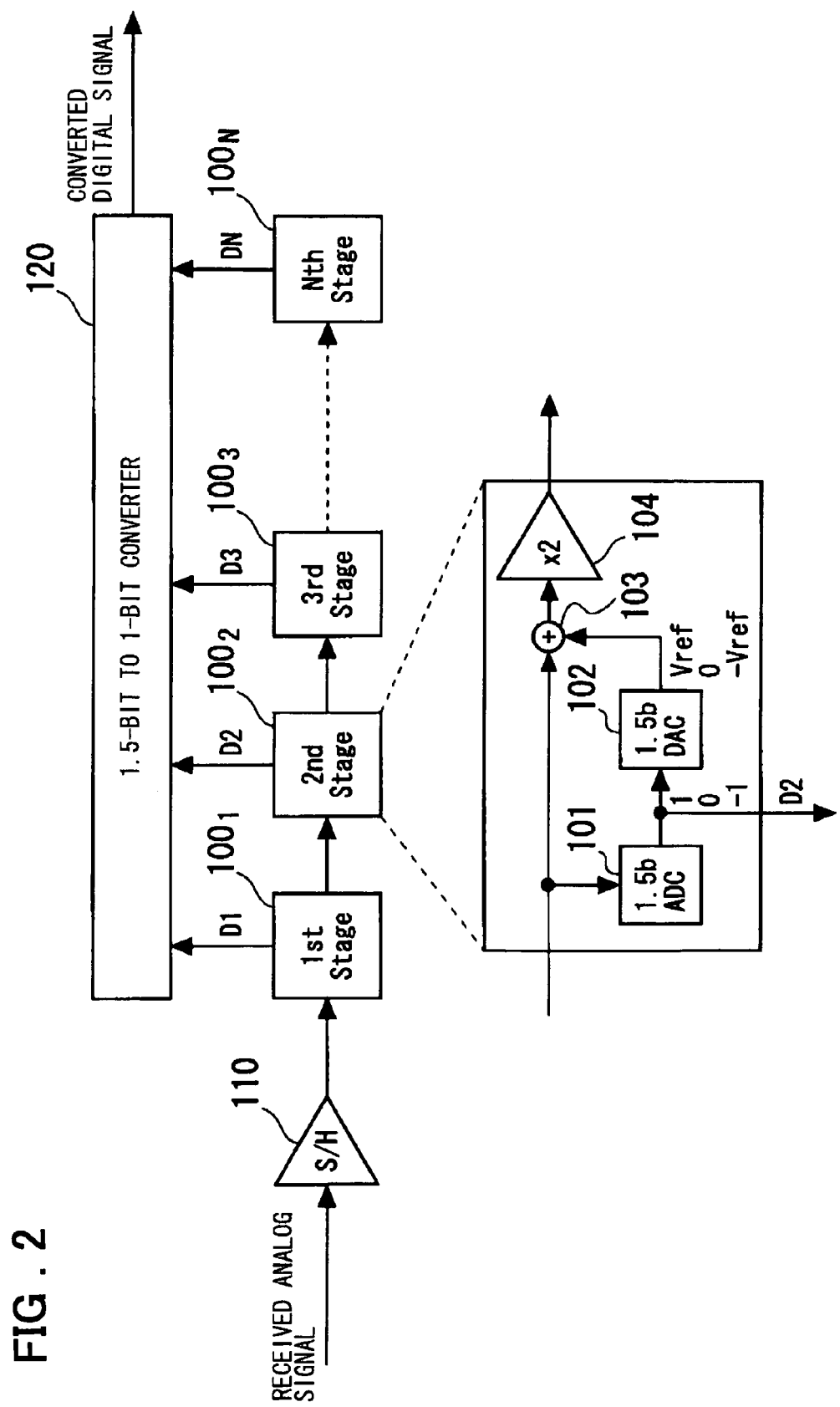
FIG. 2 is a diagram showing the configuration of a pipelined ADC in one embodiment of the present invention.

Next, the following describes an example of the pipelined ADCs 11 and 21 in FIG. 1. FIG. 2 is a diagram showing an example of the configuration of an N-stage (N is a predetermined positive integer) 1.5-bit pipelined ADC. This ADC comprises a sample and hold (S/H) circuit 110 that samples the analog input signal; N-stage 1.5-bit pipelined ADCs $100_1$–$100_N$; and a 1.5-bit-to-1-bit converter 120 that receives the outputs D1, D2, . . . , DN of the N-stage 1.5-bit pipelined ADCs $100_1$–$100_N$, converts the redundant representation to a non-redundant representation, and outputs the converted digital signal.

The 1.5-bit pipelined ADC in each stage comprises a 1.5-bit ADC 101 (1.5 b ADC), a 1.5-bit digital-to-analog converter 102 (1.5 b DAC), an adder 103, and an amplifier 104 (gain=2; also called an MBT (Multiply By Two) amplifier). The 1.5-bit ADC 101 outputs the digital output D (the subscript 2 of D2 indicates the digital output of the second-stage 1.5-bit pipelined ADC) and, at the same time, outputs the voltage $V_{out}$ to the next stage.

Referring to FIG. 2, the 1.5-bit pipelined ADC $100_1$ in the first stage (stage 1) receives the output of the sample and hold circuit 110 and evaluates the expression (1) given below.

$$V_{out}=2V_{in}-DV_{ref}$$

where $V_{in}$ is the analog input signal, $V_{ref}$ is the reference voltage of the 1.5-b DAC 102, $V_{out}$ is the output voltage (analog signal) of the amplifier 104 (MBT), and D is the output of the ADC 101 that is given by the expression (2) shown below.

$D=1$ (if $V_{in} \geq V_{ref}/4$)

$0$ (if $-V_{ref}/4 < V_{in} < V_{ref}/4$)

$-1$ (if $V_{in} \leq -V_{ref}/4$)  (2)

The 1.5-bit pipelined ADCs in the second and the following stages also receive the output voltage $V_{out}$ of the preceding stage and perform the processing similar to that in the first stage.

In the interleaved ADC configuration, the sample and hold circuits (S/H) 110 of the component ADCs must have an equal gain.

For example, with the first component ADC 10 (first pipelined ADC 11) adopted as a reference in the configuration example in FIG. 1, the difference between the gain of the sample and hold circuit (S/H) 110 (see FIG. 2) of the first pipelined ADC 11 and the gain of the sample and hold circuit (S/H) 110 of the second pipelined ADC 21 is thought of as the gain error of the second component ADC 20.

The ideal value of the gain of the amplifier (MBTs) 104 in each stage of the first stage to the Nth stage of the pipeline is assumed to be 2. The amount of deviation from 2 is the gain error of each stage in the pipelined ADC.

If there are gain errors, the error E represented by the expression (3) given below is generated. In the expression (3) given below, the gain errors in the Mth and the following stages are so small that they are ignored.

The first and second gain error correction circuits 12 and 22 in FIG. 1 evaluate the following expression (3) according to the gain errors set by correction amount control signal #1 and correction amount control signal #2 sent, respectively, from the correction circuit 30 to the first and second gain error correction circuits 12 and 22. Then, the first and second gain error correction circuits 12 and 22 correct the gain error by subtracting the result of the expression (3) from the converted digital data output from the first and second pipelined AD converters 11 and 21. For the description of the expression (3), see Patent Document 1 described above.

$$E = 2^{-2}(2g_0 - a_1)D_1 + \\ 2^{-3}(2g_0 + a_1 - a_2)D_2 + 2^{-4}(2g_0 + a_1 + a_2 - a_3)D_3 + \\ \ldots + 2^{-M-1}(2g_0 + a_1 + a_2 \ldots - a_M)D_M + \\ 2^{-M-2}(2g_0 + a_1 + a_2 \ldots + a_M)(D_{M+1} + 2^{-1}D_{M+2} + 2^{-2}D_{M+3} \ldots )$$ (3)

where $g_0$ is the gain error of the sample and hold (S/H) circuit 110 and $a_x$ is the gain error of the pipeline stage $\mathbf{100}_x$ in the xth stage.

Now, consider an L-phase interleaved ADC. In this case, the divide-by-2 multi-phase circuit 50 in FIG. 1 is replaced to a frequency division multi-phase circuit that generates divided L-phase clock signals that are space equally each other. The circuit according to the present invention uses the training signal, whose band is limited to 1/L across the band, for calibration (correction) process.

When the band-limited training signal is input to the interleaved ADC that has a gain error, an image component is generated in an aliasing area in the frequency spectrum.

Figure 3:
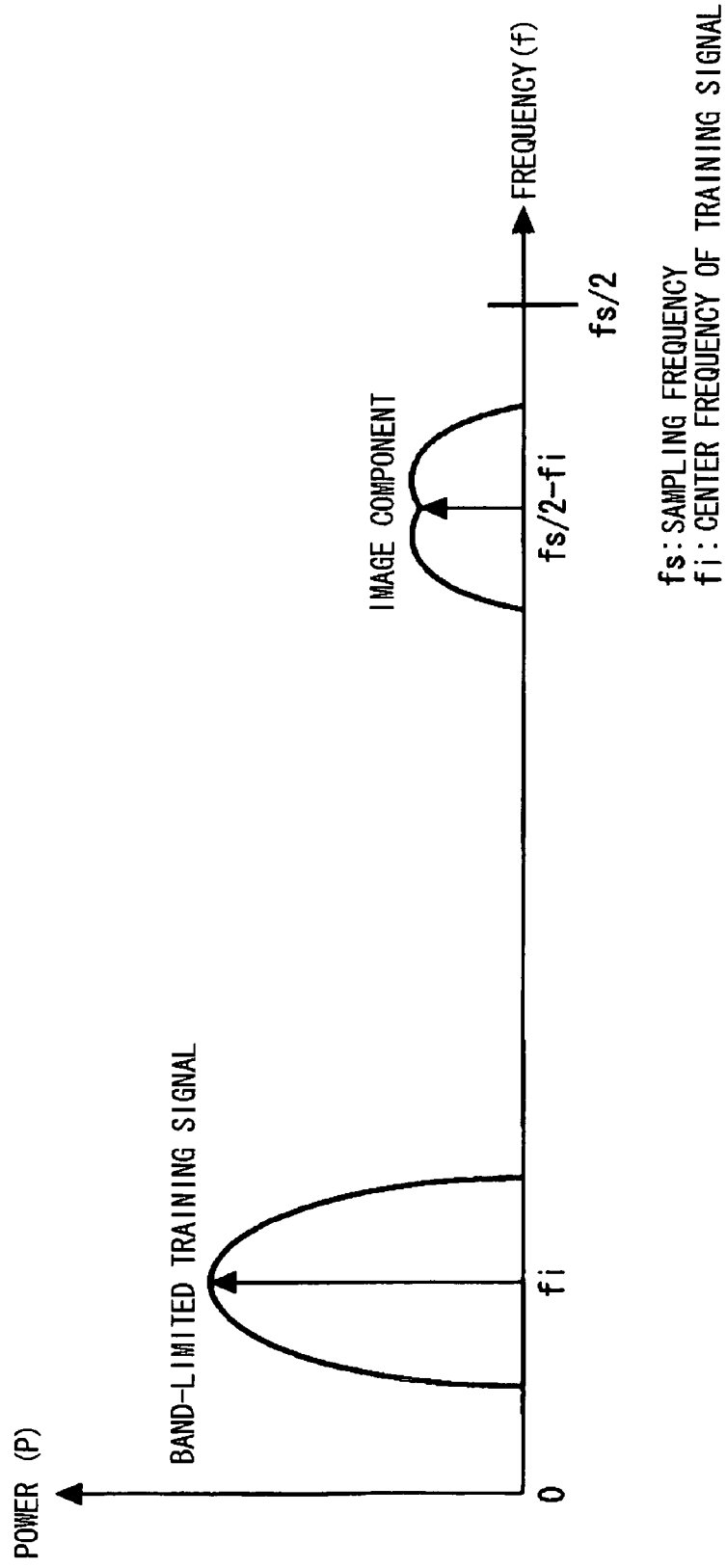
FIG. 3 is a spectrum diagram showing the filter processing of the present invention.

FIG. 3 is a diagram schematically showing an image component generated due to a gain error in a two-phase interleaved ADC. In FIG. 3, when fs is the sampling frequency (fs/2 is the Nyquist frequency) and the center frequency of the band-limited training signal is fi, an image component generated due to a gain error in the two-phase interleaved ADC has a center frequency of fs/2−fi (corresponds to aliasing or folding of fi with respect to the Nyquist frequency fs/2).

In the present embodiment, an image component generated due to a gain error is extracted by the band pass filter 32, and the gain error is corrected such that the power (electric power) of the extracted image component is minimized.

Figure 4:
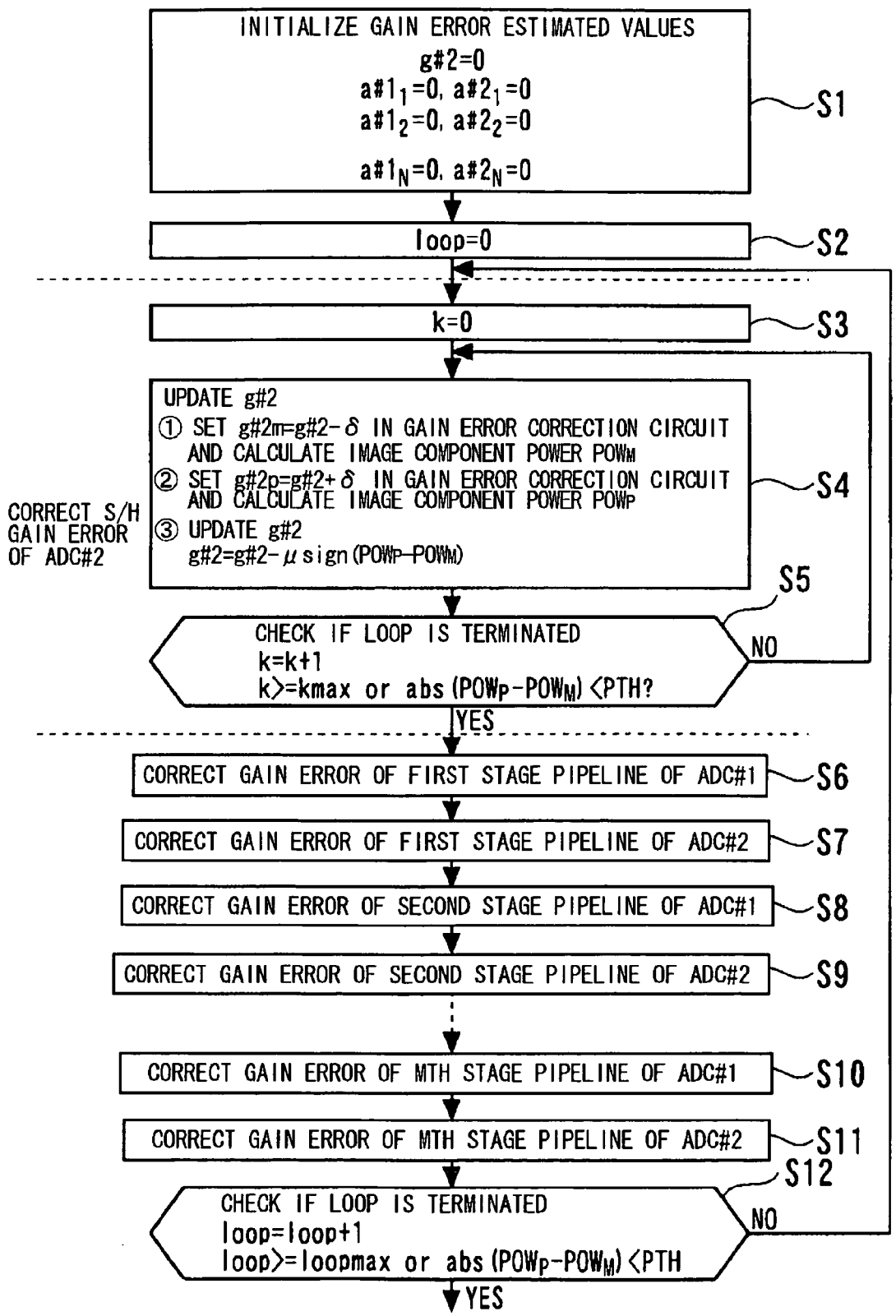
FIG. 4 is a flowchart showing the processing procedure of one embodiment of the present invention.
Figure 5:
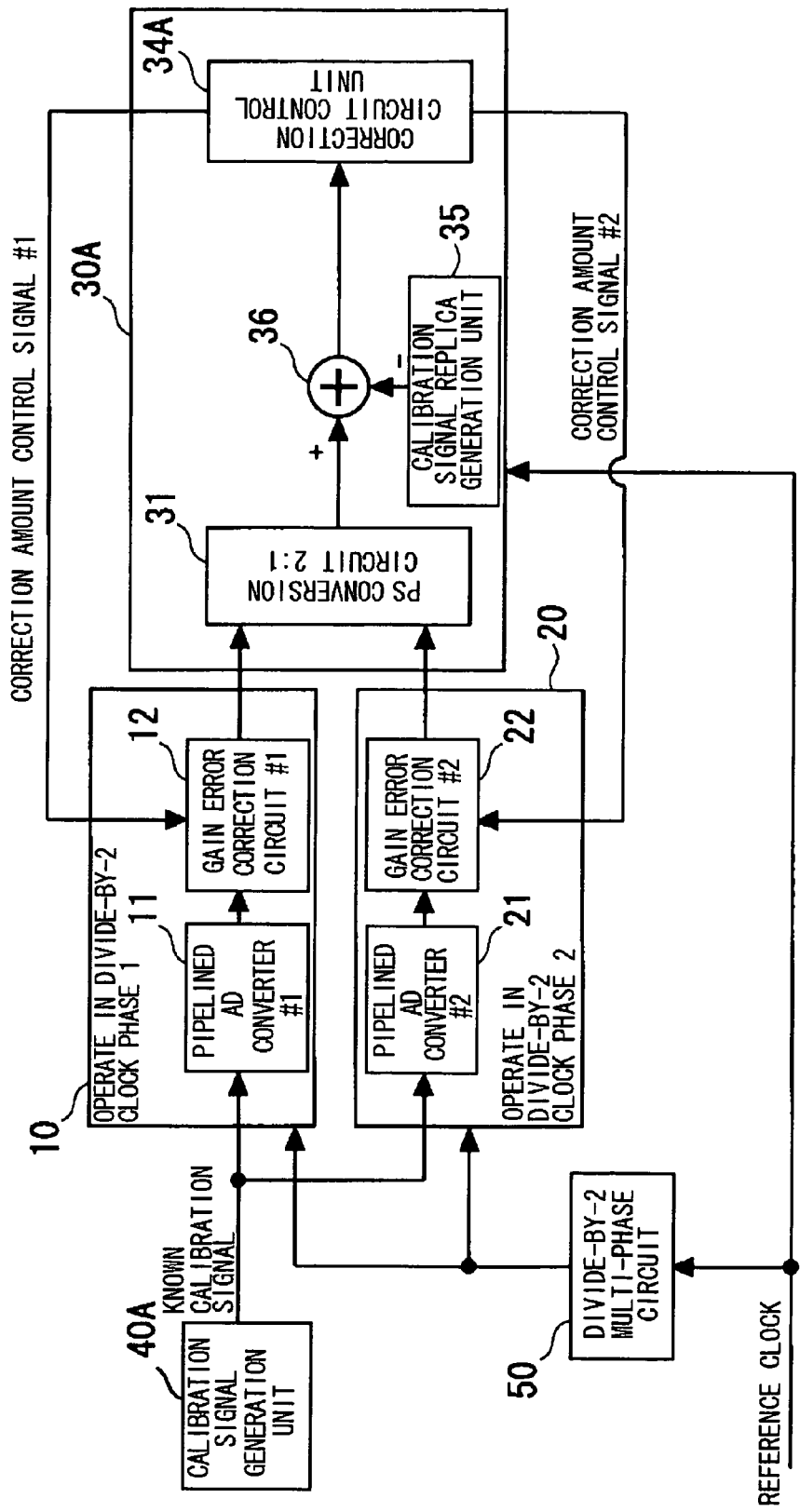
FIG. 5 is a diagram showing an example of the typical configuration of a conventional correction circuit.
Figure 6:
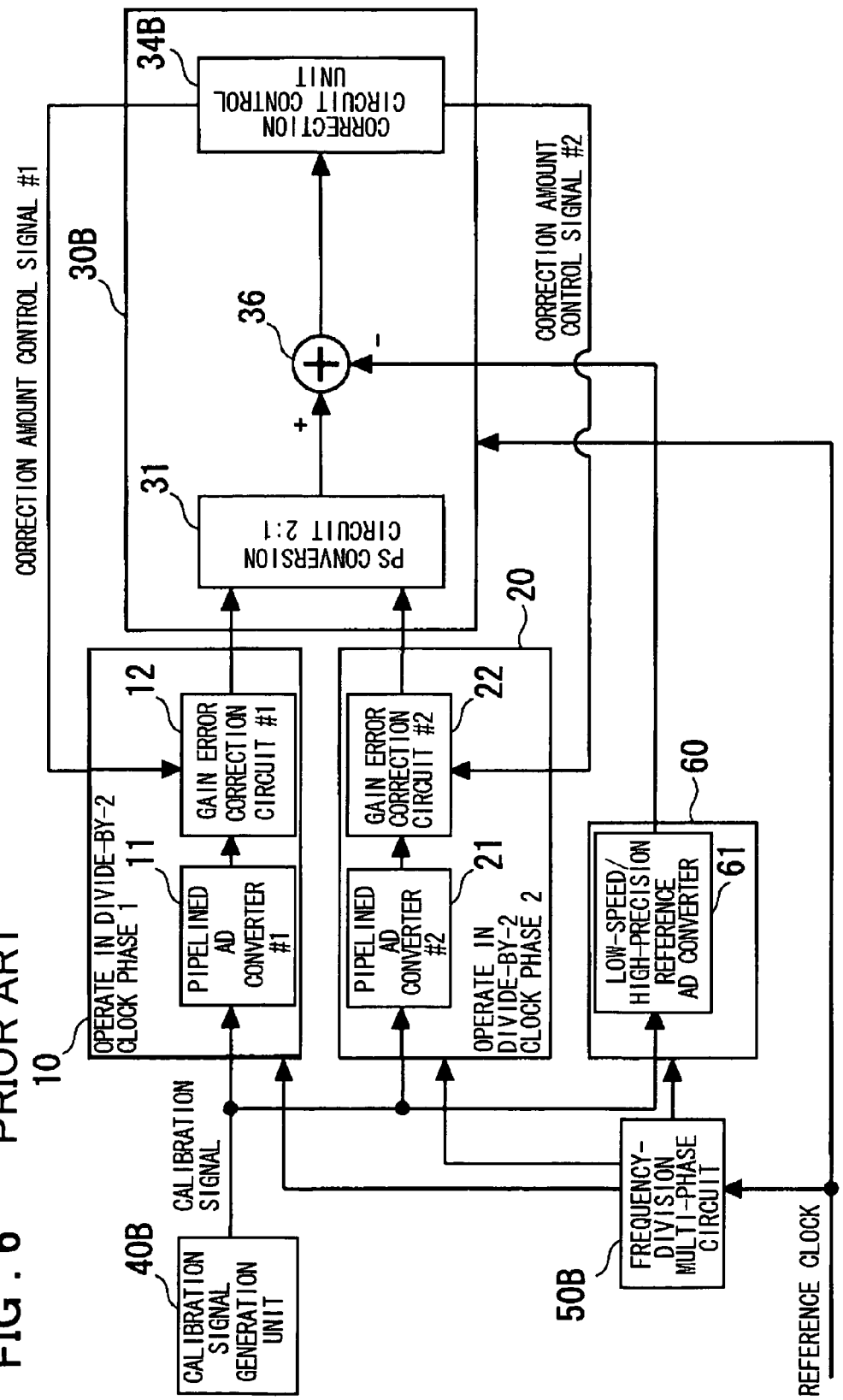
FIG. 6 is a diagram showing an example of another configuration of the conventional correction circuit.

FIG. 4 is a flowchart showing the gain error correction procedure for the two-phase interleaved ADC shown in FIG. 1. In FIG. 4, ADC#1 and ADC#2 correspond to the pipelined ADC 11 and the pipelined ADC 21 in FIG. 1, and the sample and hold (S/H) circuit corresponds to the numeral 110 in FIG. 2, and the first to the Mth pipelines correspond to the numerals $\mathbf{100}_1$ to $\mathbf{100}_M$ (not shown. M is an integer smaller than N) in FIG. 2. g#2 is the gain error of the sample and hold circuit (S/H) 110 of the pipelined ADC 21. a#$1_1$ to a#$1_N$ are gain errors in the first to the Nth pipeline stages in the pipelined ADC 11. a#$2_1$ to a#$2_N$ are gain errors in the first to the Nth pipeline stages of the pipelined ADC 21.

First, the gain error estimated values are initialized (step S1). More specifically, g#2 is initialized to 0, a#$1_1$–a#$1_N$ are initialized to 0, and a#$2_1$–a#$2_N$ are initialized to 0.

The gain error of the sample and hold (S/H) circuit of ADC#2 is corrected (steps S3, S4, S5).

After that, the correction of a pipeline gain error of ADC#1 and ADC#2 is sequentially repeated alternately from the first stage to the Mth stage (steps S6 and S7, steps S8 and S9, steps S10 and S11).

Those steps are repeated until the predetermined loop count (loopmax) is reached or the power of the image component falls below the predetermined threshold (PTH) (step S12).

Using the example of the gain error correction of the sample and hold (S/H) circuit of ADC#2, the following describes the details of the correction method in step S4 in FIG. 4 with reference to FIG. 1 and FIG. 2.

The gain error generated by subtracting δ from the current gain error estimated value g#2

$$g\#2m = g\#2 - \delta$$ (4)

is set in the gain error correction circuit 22. For other gain errors, the current estimated values (a#$1_{1-M}$, a#$2_{1-M}$) are set.

At this time, the power $POW_M$ of the image component extracted by the band pass filter 32 is calculated and saved in the storage unit (not shown).

Similarly, the gain error generated by adding δ to the current gain error estimated value g#2

$$g\#2p = g\#2 + \delta$$ (5)

is set in the gain error correction circuit 22, and the power $POW_P$ of the image component extracted by the band pass filter 32 at this time is calculated and saved in the storage unit (not shown).

If $POW_P$ is lower than $POW_M$, the gain error estimated value g#2 is increased by the step size μ assuming that the actual gain error is larger than the current estimated value.

Conversely, if $POW_P$ is higher than $POW_M$, the gain error estimated value g#2 is decreased by the step size μ assuming that the actual gain error is smaller than the current estimated value.

"sign" of μsign in g#2=g#2−μ sign($POW_P$−$POW_M$) in FIG. 4 is −1 or 1, depending upon whether the sign of ($POW_P$−$POW_M$) is negative or positive.

The processing of step S4 described above is started with k=0 (step S3) and is repeated until k reaches the predetermined loop count (k≧kmax where kmax is the predetermined loop count) or the image component power becomes equal to or lower than the predetermined threshold (PTH), that is, abs($POW_P$−$POW_M$)<PTH (step S5). In FIG. 4, the operator abs represents the absolute value.

If a pipelined ADC is used as a component ADC of the interleaved ADC, the characteristics are deteriorated by a gain error in the pipeline stages. The characteristics are also deteriorated by a variation in the gains of the sample and hold (S/H) circuits of the interleaved ADCs.

According to the present embodiment, a band-limited training signal is input to the interleaved ADC where there is a gain error to cause the interleaved ADC to generate an image component and, using the generated image component, the gain error is corrected so that the image component is minimized. Because the training signal may be any band-limited signal, there is an advantage that the configuration of the calibration signal generation unit 40 for generating the training signal can be simplified.

In this manner, even if there is a gain error as described above, the method according to the present invention can suppress characteristics deterioration. In addition, the method does not require an accurate known calibration signal generation circuit or a high-precision reference ADC as the conventional correction method, thus reducing the circuit size.

While the present invention has been described using the preferred embodiment, it is to be understood that the present invention is not limited to the configuration of the embodiment described above but that modifications and variations apparent to those skilled in the art within the scope of the present invention are included.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. An analog-to-digital conversion system comprising:
   a pipelined analog-to-digital conversion circuit for receiving an analog signal and converting the analog signal to a digital signal for output; and
   a correction circuit for controlling a correction of a gain error of said analog-to-digital conversion circuit,
   said correction circuit including:
      a filter for receiving the output signal of said analog-to-digital conversion circuit and extracting a predetermined frequency component generated by a gain error of said analog-to-digital conversion circuit; and
      a control circuit for calculating a power of the frequency component extracted by said filter and for generating a control signal for correcting the gain error of said analog-to-digital conversion circuit, based on the frequency component extracted by said filter and supplying the generated control signal to said analog-to-digital conversion circuit.

2. The analog-to-digital conversion system according to claim 1, wherein said filter comprises a band pass filter.

3. The analog-to-digital conversion system according to claim 1, wherein said control circuit generates the control signal for correcting the gain error of said analog-to-digital conversion circuit to reduce a value of the power.

4. The analog-to-digital conversion system according to claim 1, wherein a plurality of said pipelined analog-to-digital conversion circuits are provided in parallel and are driven respectively by sampling clock signals, phases of which are spaced each other.

5. The analog-to-digital conversion system according to claim 1, wherein said analog-to-digital conversion circuit comprises:
   a sample and hold circuit;
   a multi-stage (N-stage) pipelined analog-to-digital converter;
   a conversion circuit for receiving a digital output of said multi-stage (N-stage) pipelined analog-to-digital converter, converting the digital output from a redundant representation to a non-redundant representation, and outputting the converted result; and
   a gain error correction circuit for receiving the output of said conversion circuit and correcting the gain error based on the control signal.

6. The analog-to-digital conversion system according to claim 1, wherein a band-limited signal is supplied to an analog input terminal of said analog-to-digital conversion circuit;
   wherein, in said correction circuit, said filter selectively extracts a signal having a predetermined range of frequency band including a frequency obtained by subtracting a center frequency of the band-limited signal from a Nyquist frequency by letting the signal pass through said filter.

7. The analog-to-digital conversion system according to claim 1,
   wherein said control circuit comprises;
      a power calculation unit for calculating the power of the frequency component extracted by said filter; and
      a correction control unit for receiving the power calculated by said power calculation unit, generating the control signal for correcting the gain error of said analog-to-digital conversion circuit to reduce a value of the power, and supplying the control signal to said analog-to-digital conversion circuit.

8. An analog-to-digital conversion system comprising:
   a pipelined analog-to-digital conversion circuit for receiving an analog signal and converting the analog signal to a digital signal for output; and
   a correction circuit for controlling a correction of a gain error of said analog-to-digital conversion circuit.
   said correction circuit including:
      a filter for receiving the output signal of said analog-to-digital conversion circuit and extracting a predetermined frequency component generated by a gain error of said analog-to-digital conversion circuit; and
      a control circuit for generating a control signal for correcting the gain error of said analog-to-digital conversion circuit, based on the frequency component extracted by said filter and supplying the generated control signal to said analog-to-digital conversion circuit,
   wherein a band-limited signal is supplied to an analog input terminal of said analog-to-digital conversion circuit;
   wherein, in said correction circuit, said filter selectively extracts a signal having a predetermined range of frequency band including a frequency obtained by subtracting a center frequency of the band-limited signal from a Nyquist frequency by letting the signal pass through said filter; and
   wherein said control circuit comprises;
      a power calculation unit for calculating a power of the frequency component extracted by said filter; and
      a correction control unit for receiving the power calculated by said power calculation unit, generating the control signal for correcting the gain error of said analog-to-digital conversion circuit to reduce a value of the power, and supplying the control signal to said analog-to-digital conversion circuit.

9. An analog-to-digital conversion system comprising:
   a plurality of parallel pipelined analog-to-digital conversion circuits, each receiving an analog signal at an analog input terminal thereof, converting the analog signal to a digital signal, and outputting the converted signal, said plurality of analog-to-digital conversion circuits receiving clock signals as sampling clock signals, phases of said clock signals being spaced each other;
   a multiplexer for receiving and multiplexing a plurality of digital signal outputs from said plurality of analog-to-digital conversion circuits;
   a band pass filter for receiving the output signal of said multiplexer and extracting a predetermined frequency component generated by a gain error of said analog-to-digital conversion circuits;
   a power calculation unit for calculating a power of the frequency component extracted by said band pass filter; and
   a correction circuit control unit for supplying control signals to said plurality of analog-to-digital conversion circuits for correcting the gain error of said analog-to-digital conversion circuits to reduce a value of the power of the frequency component.

10. A correction circuit for correcting a gain error of a pipelined analog-to-digital conversion circuit that receives an analog signal, converts the analog signal to a digital signal, and outputs the converted signal, said correction circuit comprising:
- a filter for receiving the output signal of said analog-to-digital conversion circuit and extracting a frequency component generated by a gain error of said analog-to-digital conversion circuit; and
- a control circuit for calculating a power of the frequency component extracted by said filter and outputs a control signal for correcting the gain error of said analog-to-digital conversion circuit to reduce a value of the power.

11. A correction method for a pipelined analog-to-digital conversion circuit that receives an analog signal, converts the analog signal to a digital signal, and outputs the converted signal, said correction method comprising:
- receiving the output signal of said analog-to-digital conversion circuit and extracting a frequency component, generated by a gain error of said analog-to-digital conversion circuit by a filter;
- correcting the gain error of said analog-to-digital conversion circuit based on the frequency component extracted by said filter; and
- calculating a power of the frequency component extracted by said filter.

12. The correction method for an analog-to-digital conversion circuit according to claim 11, wherein said filter comprises a band pass filter.

13. The correction method for an analog-to-digital conversion circuit according to claim 11, further comprising:
- correcting the gain error of said analog-to-digital conversion circuit to reduce a value of the power of the extracted frequency component.

14. The correction method for an analog-to-digital conversion circuit according to claim 11, wherein a plurality of said pipelined analog-to-digital conversion circuits are provided in parallel and are driven by sampling clock signals, phases of which are spaced each other.

15. A correction method for a pipelined analog-to-digital conversion circuit that receives an analog signal, converts the analog signal to a digital signal, and outputs the converted signal, said correction method comprising:
- receiving the output signal of said analog-to-digital conversion circuit and extracting a frequency component, generated by a gain error of said analog-to-digital conversion circuit by a filter;
- correcting the gain error of said analog-to-digital conversion circuit based on the frequency component extracted by said filter;
- receiving a band-limited signal at an analog input terminal of said analog-to-digital conversion circuit;
- selectively letting a signal pass through said filter, said signal having a predetermined range of frequency band including a frequency obtained by subtracting a center frequency of the band-limited signal from a Nyquist frequency,
- calculating a power of a frequency component output by said filter; and
- generating a control signal for correcting the gain error of said analog-to-digital conversion circuit to reduce the calculated power.

16. The correction method for an analog-to-digital conversion circuit according to claim 15, wherein said analog-to-digital conversion circuit comprises:
- a sample and hold circuit;
- a multi-stage (N-stage) pipelined analog-to-digital converter;
- a conversion circuit that receives an output of said multi-stage (N-stage) pipelined stage analog-to-digital converter, converts the output from a redundant representation to a non-redundant representation, and outputs the converted result; and
- a gain error correction circuit that receives the output signal of said conversion circuit and corrects the gain error based on the control signal.

17. The correction method for an analog-to-digital conversion circuit according to claim 16, wherein there are provided at least two said analog-to-digital conversion circuits, said correction method further comprising:
- (a) correcting a gain error of the sample and hold circuit of one said analog-to-digital conversion circuit; and
- (b) correcting a gain error of pipeline stages, from a first to a Nth pipeline stages of said analog-to-digital conversion circuit for two said analog-to-digital conversion circuits, alternately.

18. The correction method for an analog-to-digital conversion circuit according to claim 17, wherein said step (a) comprises:
- (a1) updating the gain error of the sample and hold circuit of one said analog-to-digital conversion circuit from a current value to a first value, to which a predetermined amount is added in advance, and calculating a power (referred to as a "first power") of the frequency component extracted by said filter, said power corresponding to the gain error of the first value of one said analog-to-digital conversion circuit;
- (a2) updating the gain error of the sample and hold circuit of one said analog-to-digital conversion circuit from a current value to a second value, from which a predetermined amount is subtracted in advance, and calculating a power (referred to a "second power") of the frequency component extracted by said filter, said power corresponding to the gain error of the second value of one said analog-to-digital conversion circuit; and
- (a3) repeating said (a1) and (a2) until an absolute value of a difference between the first power and the second power becomes smaller than a predetermined threshold value defined in advance or until a predetermined repetition count defined in advance is reached.

19. An analog-to-digital conversion system comprising:
analog-to-digital conversion means for receiving an analog signal and converting the analog signal to a digital signal for output; and
correction means for controlling a correction of a gain error of said analog-to-digital conversion circuit,
said correction means including:
- filter means for receiving the output signal of said analog-to-digital conversion means and extracting a predetermined frequency component generated by a gain error of said analog-to-digital conversion means; and
- control means for generating a control signal for correcting the gain error of said analog-to-digital conversion means, based on the frequency component extracted by said filter means and supplying the generated control signal to said analog-to-digital conversion means.

20. The analog-to-digital conversion system according to claim 19, wherein said control means calculates a power of the frequency component extracted by said filter means and generates the control signal for correcting the gain error of said analog-to-digital conversion means to reduce a value of the power.

* * * * *